(12) United States Patent
Bui et al.

(10) Patent No.: US 8,686,529 B2
(45) Date of Patent: Apr. 1, 2014

(54) WAVELENGTH SENSITIVE SENSOR PHOTODIODES

(75) Inventors: Peter Steven Bui, Cerritos, CA (US); Narayan Dass Taneja, Long Beach, CA (US); Manoocher Mansouri Aliabadi, Studio City, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 561 days.

(21) Appl. No.: 12/689,349

(22) Filed: Jan. 19, 2010

(65) Prior Publication Data
US 2011/0175188 A1 Jul. 21, 2011

(51) Int. Cl.
*H01L 31/06* (2012.01)
(52) U.S. Cl.
USPC .................................. 257/461; 257/E31.032
(58) Field of Classification Search
USPC .................. 257/449, 461, 463, 466, E31.032
See application file for complete search history.

(56) References Cited

U.S. PATENT DOCUMENTS

| | | | |
|---|---|---|---|
| 3,041,226 A | 6/1962 | Pennington | |
| 3,713,921 A | 1/1973 | Fleischer et al. | |
| 3,765,969 A | 10/1973 | Kragness et al. | |
| 3,801,390 A | 4/1974 | Lepselter et al. | |
| 3,808,068 A | 4/1974 | Johnson et al. | |
| 3,887,936 A | 6/1975 | Shannon et al. | |
| 4,210,923 A | 7/1980 | North et al. | |
| 4,219,368 A * | 8/1980 | David | 136/249 |
| 4,238,760 A * | 12/1980 | Carr | 257/443 |
| 4,290,844 A | 9/1981 | Rotolante et al. | |
| 4,874,939 A | 10/1989 | Nishimoto et al. | |
| 4,887,140 A | 12/1989 | Wang | |
| 4,904,608 A | 2/1990 | Gentner et al. | |
| 4,904,861 A | 2/1990 | Epstein et al. | |

(Continued)

FOREIGN PATENT DOCUMENTS

| | | |
|---|---|---|
| EP | 0 347 157 | 12/1989 |
| EP | 0436282 | 7/1991 |

(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, 1995.

(Continued)

*Primary Examiner* — Wensing Kuo
(74) *Attorney, Agent, or Firm* — Novel IP

(57) ABSTRACT

The present invention is directed toward a dual junction photodiode semiconductor devices with improved wavelength sensitivity. The photodiode employs a high quality n-type layer with relatively lower doping concentration and enables high minority carrier lifetime and high quantum efficiency with improved responsivity at multiple wavelengths. In one embodiment, the photodiode comprises a semiconductor substrate of a first conductivity type, a first impurity region of a second conductivity type formed epitaxially in the semiconductor substrate, a second impurity region of the first conductivity type shallowly formed in the epitaxially formed first impurity region, a first PN junction formed between the epitaxially formed first impurity region and the second impurity region, a second PN junction formed between the semiconductor substrate and the epitaxially formed first impurity region, and at least one passivated V-groove etched into the epitaxially formed first impurity region and the semiconductor substrate.

17 Claims, 14 Drawing Sheets

(56) References Cited

U.S. PATENT DOCUMENTS

| | | |
|---|---|---|
| 4,998,013 A | 3/1991 | Epstein et al. |
| 5,049,962 A | 9/1991 | Huang et al. |
| 5,053,318 A | 10/1991 | Gulla et al. |
| 5,144,379 A | 9/1992 | Eshita et al. |
| 5,214,276 A | 5/1993 | Himoto et al. |
| 5,237,197 A | 8/1993 | Snoeys et al. |
| 5,252,142 A | 10/1993 | Matsuyama et al. |
| 5,254,480 A | 10/1993 | Tran |
| 5,276,955 A | 1/1994 | Noddin et al. |
| 5,408,122 A | 4/1995 | Reele |
| 5,430,321 A | 7/1995 | Effelsberg |
| 5,446,308 A | 8/1995 | Piccone et al. |
| 5,446,751 A | 8/1995 | Wake |
| 5,501,990 A | 3/1996 | Holm et al. |
| 5,576,559 A | 11/1996 | Davis |
| 5,599,389 A | 2/1997 | Iwasaki |
| 5,656,508 A | 8/1997 | So et al. |
| 5,818,096 A | 10/1998 | Ishibashi et al. |
| 5,825,047 A | 10/1998 | Ajisawa et al. |
| 5,869,834 A | 2/1999 | Wipenmyr |
| 5,889,313 A | 3/1999 | Parker |
| 5,923,720 A | 7/1999 | Barton et al. |
| 5,928,438 A | 7/1999 | Salami et al. |
| 6,027,956 A | 2/2000 | Irissou |
| 6,175,141 B1 | 1/2001 | Hofbauer et al. |
| 6,218,684 B1 | 4/2001 | Kuhara et al. |
| 6,326,300 B1 | 12/2001 | Liu et al. |
| 6,326,649 B1 | 12/2001 | Chang et al. |
| 6,352,517 B1 | 3/2002 | Flock et al. |
| 6,426,991 B1 | 7/2002 | Mattson et al. |
| 6,438,296 B1 | 8/2002 | Kongable |
| 6,489,635 B1 | 12/2002 | Sugg |
| 6,504,158 B2 | 1/2003 | Possin |
| 6,510,195 B1 | 1/2003 | Chappo et al. |
| 6,546,171 B2 | 4/2003 | Fukutomi |
| 6,569,700 B2 | 5/2003 | Yang |
| 6,593,636 B1 | 7/2003 | Bui et al. |
| 6,670,258 B2 | 12/2003 | Carlson et al. |
| 6,734,416 B2 | 5/2004 | Carlson et al. |
| 6,772,729 B2 | 8/2004 | Brosseau et al. |
| 6,815,790 B2 | 11/2004 | Bui et al. |
| 6,826,080 B2 | 11/2004 | Park et al. |
| 7,057,254 B2 | 6/2006 | Bui et al. |
| 7,112,465 B2 | 9/2006 | Goushcha et al. |
| 7,198,972 B2 | 4/2007 | Sato |
| 7,242,069 B2 | 7/2007 | Bui et al. |
| 7,279,731 B1 | 10/2007 | Bui et al. |
| 7,423,305 B2 * | 9/2008 | Shinohara et al. ............ 257/292 |
| 2001/0034105 A1 | 10/2001 | Carlson |
| 2002/0056845 A1 | 5/2002 | Iguchi et al. |
| 2004/0104351 A1 | 6/2004 | Shibayama |
| 2004/0206886 A1 | 10/2004 | Carlson et al. |
| 2004/0222358 A1 | 11/2004 | Bui et al. |
| 2004/0241897 A1 | 12/2004 | Rhee et al. |
| 2004/0262652 A1 | 12/2004 | Goushcha et al. |
| 2005/0186754 A1 | 8/2005 | Kim |
| 2006/0220078 A1 | 10/2006 | Bui et al. |
| 2006/0255420 A1 | 11/2006 | Bui et al. |
| 2006/0278898 A1 | 12/2006 | Shibayama |
| 2007/0090394 A1 | 4/2007 | Bui et al. |
| 2007/0257329 A1 | 11/2007 | Bui et al. |
| 2007/0278534 A1 | 12/2007 | Bui et al. |
| 2007/0296005 A1 | 12/2007 | Bui et al. |
| 2008/0067622 A1 | 3/2008 | Bui et al. |
| 2008/0099871 A1 | 5/2008 | Bui et al. |
| 2008/0128846 A1 | 6/2008 | Bui et al. |
| 2008/0277753 A1 | 11/2008 | Bui et al. |

FOREIGN PATENT DOCUMENTS

| | | |
|---|---|---|
| EP | 0 723 301 A2 | 5/1997 |
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

WAVELENGTH SENSITIVE SENSOR PHOTODIODES

FIELD OF INVENTION

The present invention relates generally to the field of wavelength sensitive photodiodes and more specifically to photodiodes with V-groove that have high minority carrier lifetime and quantum efficiency.

BACKGROUND OF THE INVENTION

Photodiodes comprise of multiple radiation sensitive junctions formed in semiconductor material. Within a photodiode, charge carriers are created by light that illuminates the junction and photo current is generated dependent upon the degree of illumination. Similarly, a photodiode array comprises a plurality of light sensitive spaced-apart elements, comprising of a semiconductor junction and a region of high response where the photo-generated charge carriers are collected. Photodiodes are used in various applications including, but not limited to, optical position encoding, and low light-level imaging, such as night photography, nuclear medical imaging, photon medical imaging, multi-slice computer tomography (CT) imaging, radiation detection and ballistic photon detection.

Photodiodes are characterized by certain characteristics, such as electrical, optical, current (I), voltage (V), and noise. Electrical characteristics of photodiode dominantly include shunt resistance, series resistance, junction capacitance, rise or fall time and frequency response. Noise in photodiodes is generated by a plurality of sources including, but not limited to, thermal noise, quantum or photon noise, and flicker noise.

FIG. 1 shows a cross sectional view of a prior art wavelength sensitive photodiode device 100. The device 100 typically comprises two PN junctions: first junction 105 comprised of shallow boron P+ 120 implanted into N deep driven-in layer 125 and second junction 110 comprised of phosphorus deep diffusion of the N-layer 125 into a high resistivity P-type silicon substrate wafer 103. Appropriate cathode 101 and anode 102, 104 metal contacts are formed and revealed through antireflective layers 115. Electrode terminals comprising cathode 101 and anode 102, in combination, form output terminals of a first photodiode $PD_1$ associated with the first junction 105, while cathode 101 and anode 104 form output terminals of a second photodiode $PD_2$ associated with the second junction 110. However, one of the disadvantages of such prior art photodiode device 100 is that the doping concentration of the N-layer 125 is typically high and on the order of $1 \times 10^{16}/cm^3$, resulting in low minority carrier lifetime and low quantum efficiency of the first photodiode 105.

FIG. 2 shows typical spectral responsivity of 0.15 A/W prior art first photodiode $PD_1$, associated with the first PN junction 105 of FIG. 1, at 660 nm wavelength. Referring now to FIGS. 1 and 2 simultaneously, curve 205 represents the spectral sensitivity derived from the first PN junction 105 (photodiode $PD_1$), which has a peak $p_1$ at a shorter wavelength side. Curve 210 represents spectral sensitivity derived from the second PN junction 110 (photodiode $PD_2$), which has a peak $p_2$ at a longer wavelength side. It can be observed from FIG. 2 that the responsivity of the second photodiode $PD_2$ is higher, as depicted by curve 210, in comparison to the first photodiode $PD_1$.

Accordingly, there is need in the prior art for an improved wavelength sensitive photodiode that employs high quality n-type layer with relatively lower doping concentration. Specifically, there is need in the prior art for novel structure of a photodiode that enables high minority carrier lifetime and high quantum efficiency with improved responsivity at multiple wavelengths.

SUMMARY OF THE INVENTION

The present invention is directed toward a dual junction photodiode semiconductor device having improved wavelength sensitivity. The photodiode employs a high quality n-type layer with relatively lower doping concentration and enables high minority carrier lifetime and high quantum efficiency with improved responsivity at multiple wavelengths. In one embodiment, the photodiode comprises a) a semiconductor substrate of a first conductivity type; b) a first impurity region of a second conductivity type formed epitaxially in said semiconductor substrate; c) a second impurity region of the first conductivity type shallowly formed in said epitaxially formed first impurity region; d) a first PN junction formed between said epitaxially formed first impurity region and said second impurity region; e) a second PN junction formed between said semiconductor substrate and said epitaxially formed first impurity region; and f) at least one passivated V-groove etched into the said epitaxially formed first impurity region and the said semiconductor substrate.

Optionally, the dual junction photodiode semiconductor device's two PN junctions are formed at first and second different depths from the surface of said common semiconductor substrate, the second depth being deeper than the first depth. The epitaxially formed first impurity region has a doping concentration of about $1 \times 10^{14}/cm^3$. The dual junction photodiode semiconductor device further comprises a) a first output electrode connected to said epitaxially formed first impurity region; b) a second output electrode connected to the second impurity region; and c) a third output electrode connected to said semiconductor substrate, wherein said first and second output electrodes are output electrodes of a first photodiode associated with said first PN junction, and said second and third output electrodes are output electrodes of a second photodiode associated with said second PN junction. Optionally, the dual junction photodiode semiconductor device has a first conductivity type p+ and a second conductivity type n+.

In another embodiment, the dual junction photodiode semiconductor device comprises a) a semiconductor substrate of a first conductivity type; b) a first impurity region of a second conductivity type formed epitaxially in said semiconductor substrate; c) a second impurity region of the first conductivity type shallowly formed in said epitaxially formed first impurity region; d) a first PN junction formed between said epitaxially formed first impurity region and said second impurity region and associated with a first photodiode element; e) a second PN junction formed between said semiconductor substrate and said epitaxially formed first impurity region and associated with a second photodiode element; f) the two PN junctions formed at first and second different depths from the surface of said common semiconductor substrate, the second depth being deeper than the first depth; g) at least one V-groove etched into the said epitaxially formed first impurity region and the said semiconductor substrate; and h) a dose of said first conductivity type surface implanted onto walls of the said at least one V-groove prior to passivation of the said at least one V-groove.

Optionally, the epitaxially formed first impurity region has a doping concentration of about $1 \times 10^{14}/cm^3$. The dual junction photodiode semiconductor device further comprises a first output electrode connected to said epitaxially formed first impurity region; a second output electrode connected to the second impurity region; and a third output electrode connected to said semiconductor substrate, wherein said first and second output electrodes are output electrodes of the said first photodiode associated with said first PN junction, and said second and third output electrodes are output electrodes of the said second photodiode associated with said second PN junction. Optionally, the first conductivity type is p+ and the second conductivity type is n+.

In another embodiment, the dual junction photodiode semiconductor device comprises a) a semiconductor substrate of a first conductivity type; b) a first impurity region of a second conductivity type formed epitaxially in said semiconductor substrate; c) a second impurity region of the first conductivity type shallowly formed in said epitaxially formed first impurity region; d) a first PN junction formed between said epitaxially formed first impurity region and said second impurity region and associated with a first photodiode element; e) a second PN junction formed between said semiconductor substrate and said epitaxially formed first impurity region and associated with a second photodiode element; f) at least one V-groove etched into the said epitaxially formed first impurity region and the said semiconductor substrate; and g) a dose of said first conductivity type surface implanted onto walls of the said at least one V-groove.

Optionally, the two PN junctions are formed at first and second different depths from the surface of said common semiconductor substrate, the second depth being deeper than the first depth. The epitaxially formed first impurity region has a doping concentration of about $1 \times 10^{14}/cm^3$. The device further comprises a first output electrode connected to said epitaxially formed first impurity region; a second output electrode connected to the second impurity region; and a third output electrode connected to said semiconductor substrate, wherein said first and second output electrodes are output electrodes of the said first photodiode associated with said first PN junction, and said second and third output electrodes are output electrodes of the said second photodiode associated with said second PN junction. The first conductivity type is n+ and the second conductivity type is p+.

BRIEF DESCRIPTION OF THE DRAWINGS

These and other features and advantages of the present invention will be appreciated, as they become better understood by reference to the following detailed description when considered in connection with the accompanying drawings.

DETAILED DESCRIPTION

Various modifications to the preferred embodiment, disclosed herein, will be readily apparent to those of ordinary skill in the art and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

Figure 3A:
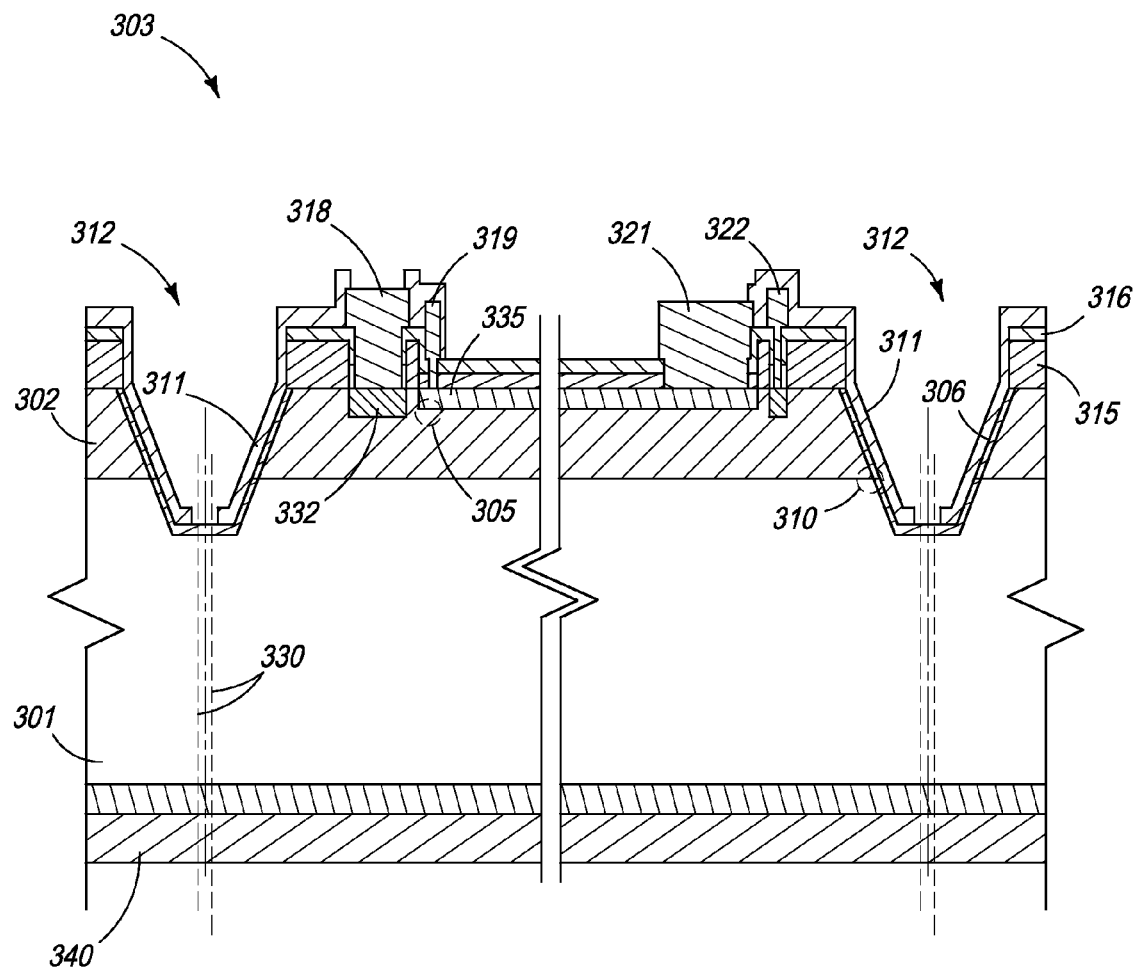
FIG. 3a shows a cross sectional view of one embodiment of the Wavelength Sensitive Sensor Photodiode with V-Groove of the present invention.

FIG. 3a shows a cross sectional view of one embodiment of the Wavelength Sensitive Sensor Photodiode 303 with V-Groove (hereinafter referred to as WSSP-V) of the present invention. In accordance with an aspect of the present invention, WSSP-V 303 comprises an epitaxial layer 302 grown over a substrate wafer 301. In one embodiment, substrate wafer 301 is p-type high resistivity silicon while epitaxial layer 302 is n-type silicon. Persons of ordinary skill in the art would appreciate that the materials and doping can be varied in alternate embodiments. Since light beam of a shorter wavelength is absorbed near the surface of a semiconductor, whereas light beam of a longer wavelength reaches a deeper section, the present invention is a dual junction photoelectric semiconductor device 303 comprising: a first junction 305 comprised of shallow boron p+ layer 335 diffused into n-type epitaxial layer 302 and second junction 310 comprised of n-type epitaxial layer 302 with the p-type substrate wafer 301. Use of dual junctions at two different depths within the photodiode device 303 enables wavelength sensitivity across a wide range of light wavelengths.

Front-side metal contact pads 318, 319, 321, 322 and back-side metallization 340 provide necessary electrical contacts for the photodiode 303. Thus, electrode terminals comprising cathode 318 and anode 321 in combination, form output terminals of a first photodiode $PD_1$ associated with the first junction 305, while cathode 318 and anode 340 form output terminals of a second photodiode $PD_2$ associated with the second junction 310.

Figure 1:
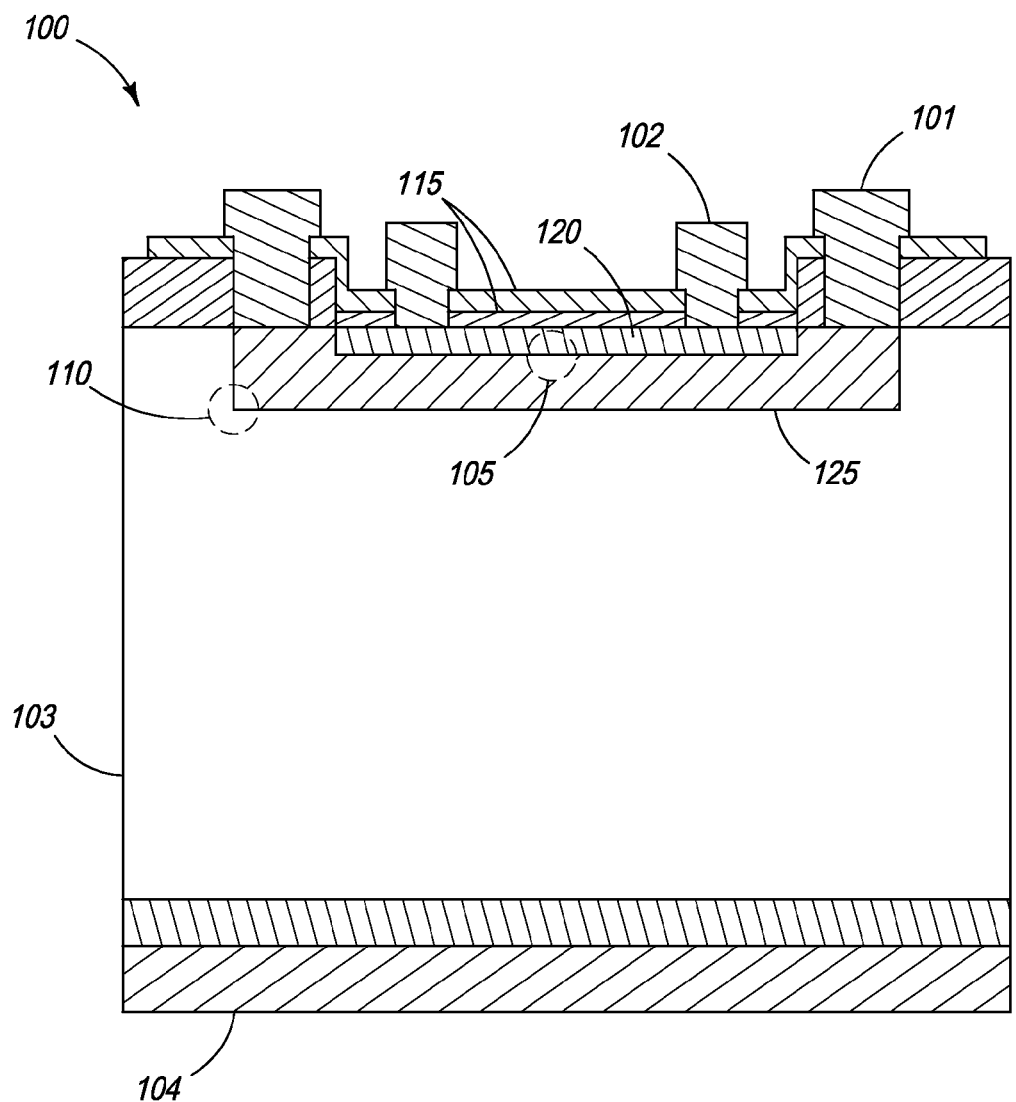
FIG. 1 shows a cross sectional view of an embodiment of prior art wavelength sensitive photodiode device.

In contrast to the structure of prior art photodiode 100 of FIG. 1, the composite photodiode 303 developed using epitaxial growth, in accordance with an aspect of the present invention, enables the creation of a high quality n-layer 302 that in one embodiment requires relatively lower doping concentration of approximately $1\times10^{14}/cm^3$. The lower doping concentration, compared to that of prior art photodiode 100 of FIG. 1, results in higher minority carrier lifetime and high quantum efficiency of the first photodiode $PD_1$ associated with the first junction 305. Also, since the first photodiode $PD_1$ (P on N) of the WSSP-V device 303 has a high minority carrier lifetime n-epitaxial layer 302 as the base of the $PD_1$ diode, most photo generated minority carriers can diffuse to the P+N junction 305 of $PD_1$ and be collected, resulting in high responsivity at 660 nm. However, in the structure of prior art photodiode 100 of FIG. 1, the base of the first P+N photodiode junction 105 is made by phosphorous ion implantation followed by annealing and deep drive oxidation. Using this method, the doping concentration in the n-layer 125 is relatively high (in the range of $1\times10^{15}$ to $1\times10^{16}/cm^3$), resulting in low minority carrier lifetime and hence low responsivity at 660 nm.

In accordance with another aspect of the present invention, to isolate the device chips from each other, a V-groove etch is performed and the walls 311 of the V-grooves 312 are passivated with PECVD oxide after implanting a light dose boron surface layer 306 in the V-grooves 312. Since the surface of p-type silicon 301 can get converted to n-type and which can give the N on P device a high leakage current, the silicon surface of the V-grooves 312 is ion implanted with the low boron dose 306 in the order of about $1\times10^{11}$ $cm^{-2}$. In one embodiment, the front side of the photodiode 303 is covered with first and second antireflective layers 315, 316 of silicon oxide and silicon nitride respectively.

Figure 3B:
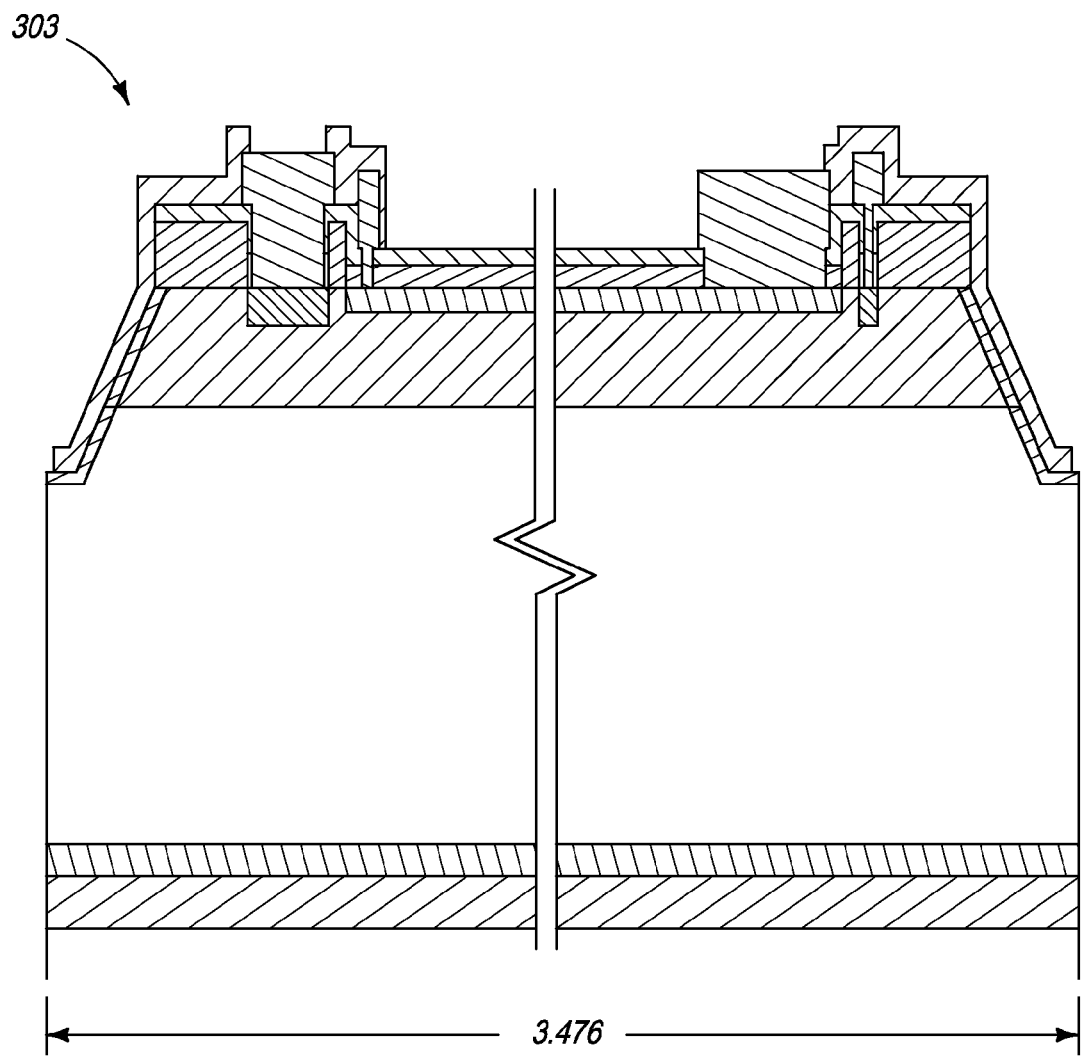
FIG. 3b shows dimensional details of the photodiode chip of the present invention after saw-cut.

In one specific embodiment of the photodiode 303 of the present invention, some example dimensional specifications are as follows: Overall cross-sectional thickness of device wafer 303 is on the order of 410 µm including a 10 µm thick epitaxial layer 302. The bottom of the V-groove 312 is 0.35 mm wide and has a depth of about 20 µm while the walls of the V-groove 312 are angled at 54.7 degrees within the device 303. The metal contact 318 is 0.125 mm wide and is 0.263 mm from chip edge 330. The n+ ohmic contact 332 is 0.110 mm wide and is 0.27061 mm from chip edge 330. Contacts 318 and 319 are 0.030 mm apart and contact 319 is 0.030 mm wide. Ohmic contact 332 is spaced 0.025 mm apart from shallow p+ diffused layer 335. Metal contact 321 is 0.180 mm wide while contact 322 is 0.040 mm wide. Ohmic contact 338 is 0.025 mm. The overall size of the chip before saw cut is of the order of 3.505 mm while that of the saw cut chip is about 3.476 mm. FIG. 3b shows dimensional details of chip 303 after saw-cut, which is 3.476 mm in accordance with one embodiment of the present invention.

Figure 3C:
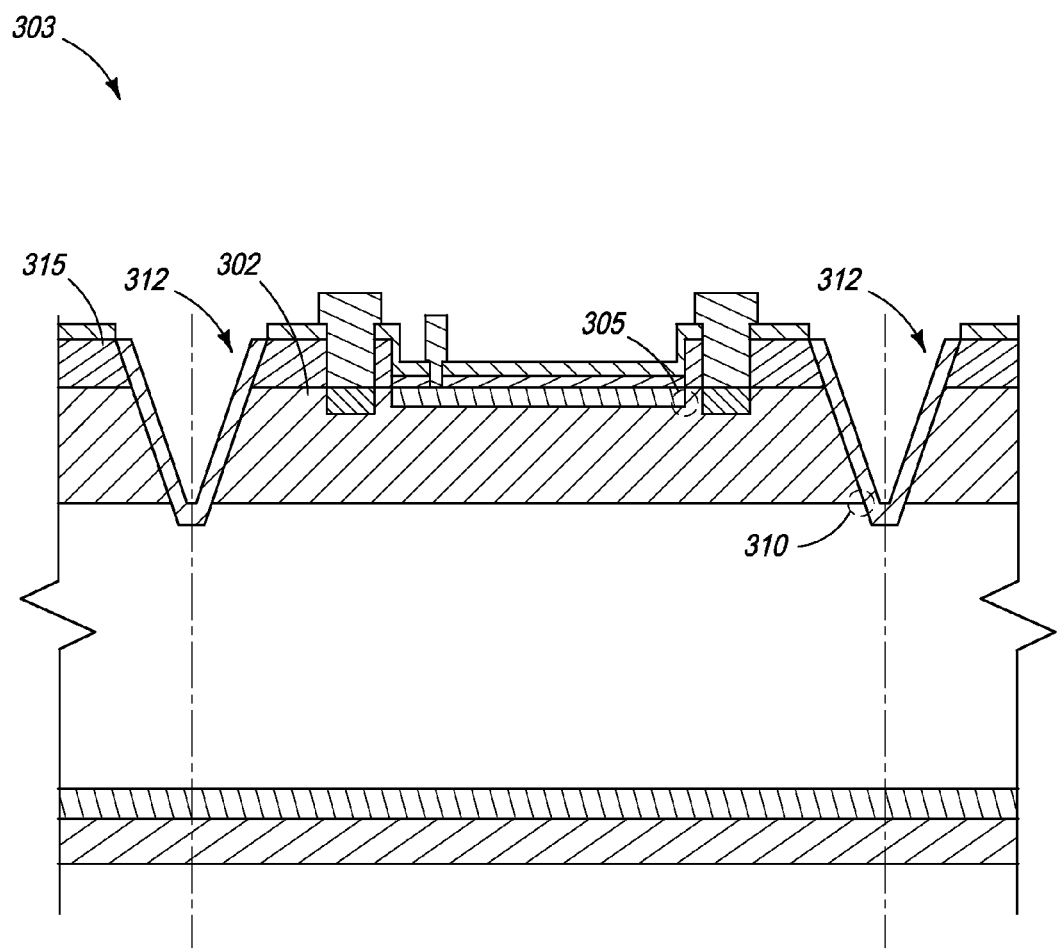
FIG. 3c shows another embodiment of the photodiode chip of the present invention.

FIG. 3c shows another embodiment of chip 303 where the bottom of the V-groove 312 is in the range of approximately 0.35 mm wide but has a depth of in the range of approximately 20 µm, for example, when measured from the surface of the thick silicon oxide layer 315. The walls of the V-groove 312 are angled in the range of approximately 54.7 degrees within the device 303. Also, the combined thickness of the epitaxial layer 302 and the thick silicon oxide layer 315 is in the range of approximately 10 µm. The overall cross-sectional thickness of device wafer 303 is in the range of approximately 410 µm including an approximately 10 µm thick combined epitaxial layer 302 and silicon oxide layer 315. Also in this embodiment the V-groove 312 is passivated with a layer of silicon oxide, but does not have the light boron surface layer 306 of the embodiment of FIG. 3a in order to have a lower cost version of the device 303 although this device version might have higher leakage current.

Figure 3D:
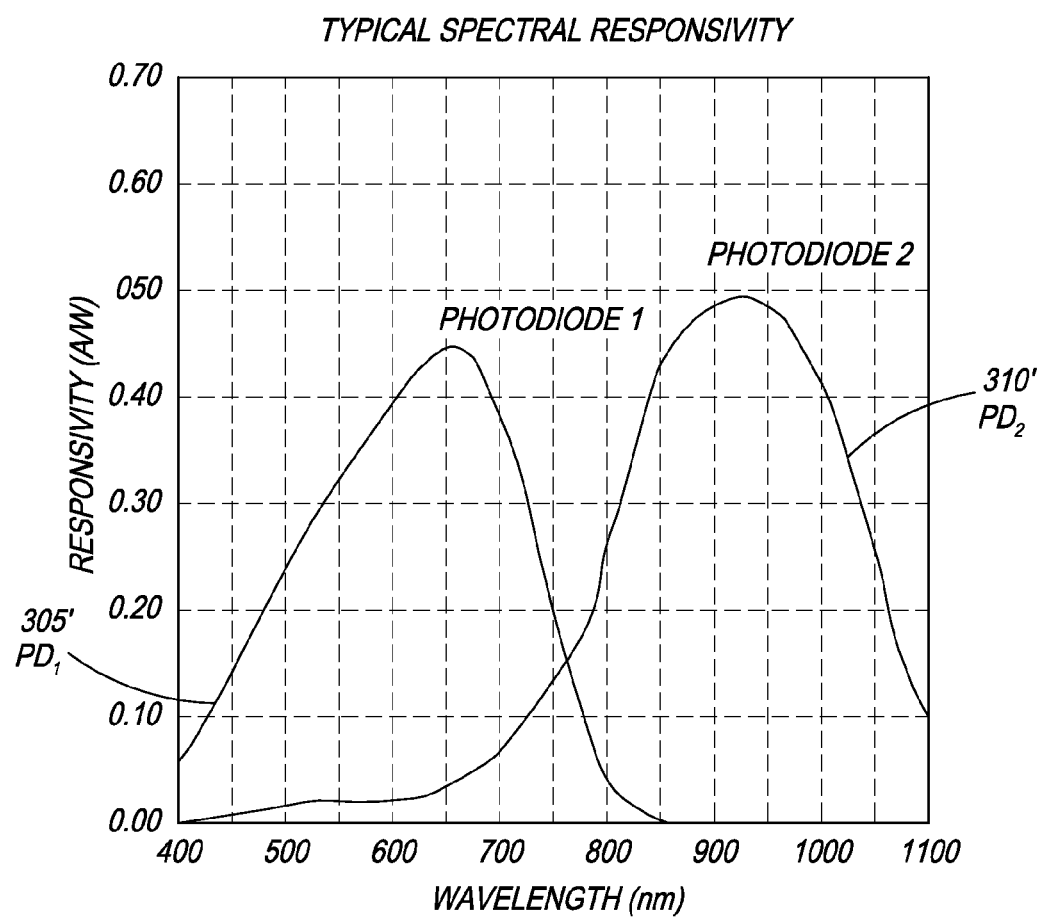
FIG. 3d shows responsivity of a 0.45 A/W at 660 nm photodiode.

FIG. 3d shows typical responsivity of 0.45 A/W at 660 nm for the first photodiode $PD_1$ associated with the first junction 305. Curve 305' represents the spectral sensitivity derived from the first PN junction 305 (photodiode $PD_1$), which has a peak at a shorter wavelength side. Curve 310' represents spectral sensitivity derived from the second PN junction 310 (photodiode $PD_2$), which has a peak at a longer wavelength side due to the use of the high resistivity and high lifetime P-type substrate 301.

Figure 2:
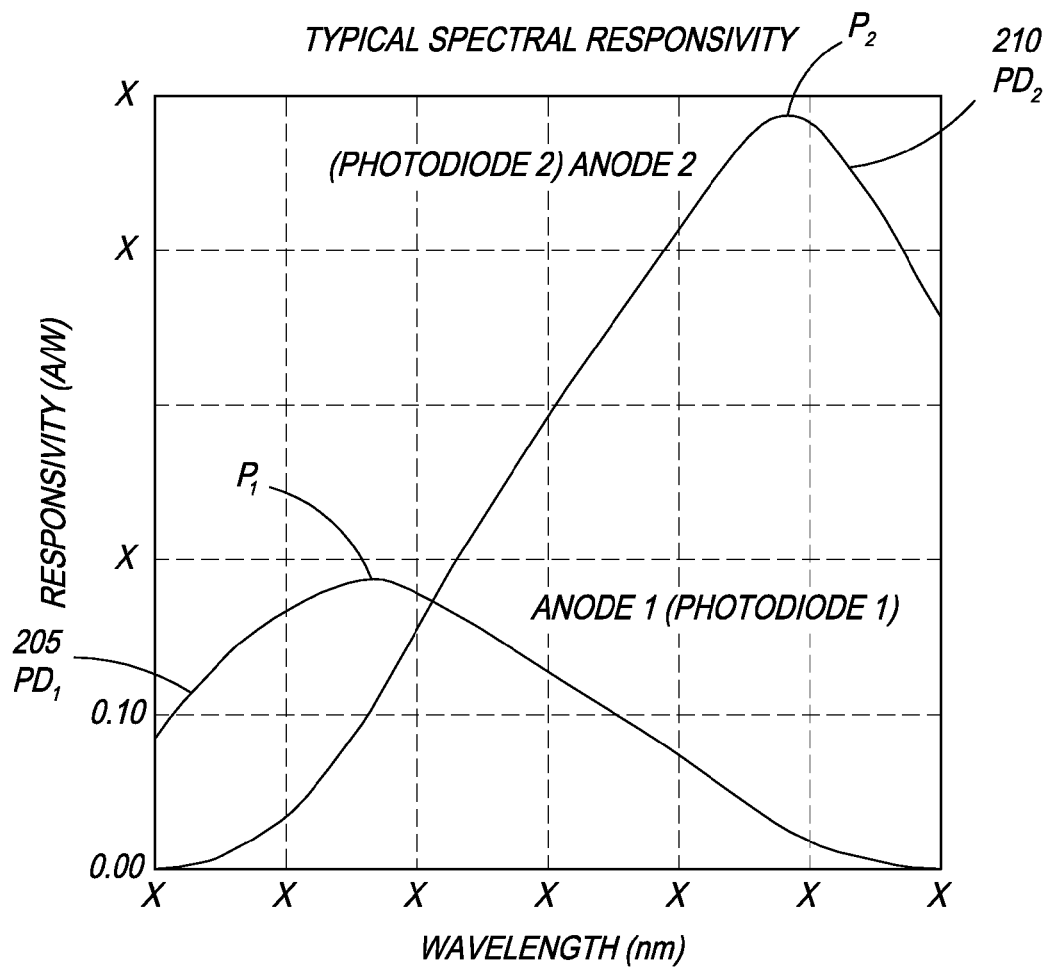
FIG. 2 shows responsivity of a 0.15 A/W at 660 nm prior art photodiode.

Comparing the responsivity graphs of FIG. 3d, reflecting the photodiode device of the present invention, with the responsivity graphs of FIG. 2 of the prior art photodiode device, it can be observed that the responsivity of the first photodiode $PD_1$ (associated with the first junction 305) of the present invention is much improved reaching a sensitivity of the order of 0.45 A/W at peak at 660 nm as compared to that of 0.15 A/W at peak at 660 nm in prior art device. Persons of ordinary skill in the art should appreciate that since the device of the present invention has high responsivities at both 660 nm and 940 nm, it can be used in all applications (such as in pulse oximeter sensors and other medical sensor applications) where clear, recognizable photocurrents at both short (660 nm) and long (940 nm) wavelengths are needed.

The manufacturing process of one embodiment of the Wavelength Sensitive Sensor Photodiode with V-Groove (WSSP-V) of the present invention will now be described in greater detail. Persons of ordinary skill in the art should note that although one exemplary manufacturing process is described herein, various modifications may be made without departing from the scope and spirit of the invention. Reference is now made to FIG. 3a, which is a cross sectional view of one embodiment of the WSSP-V of the present invention, and FIGS. 4a through 4p which are also cross-sectional views of the WSSP-V of FIG. 3a, illustrating exemplary manufacturing steps of the embodiment. Modifications or alterations to the manufacturing steps, their corresponding details, and any order presented may be readily apparent to those of ordinary skill in the art. Thus, the present invention contemplates many possibilities for manufacturing the sensor photodiode of the present invention and is not limited to the examples provided herein.

Figure 4A:
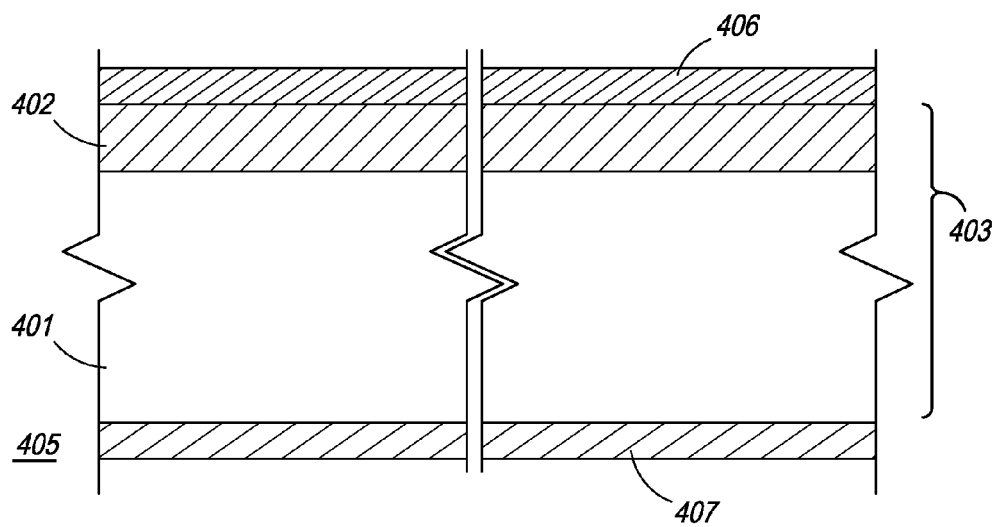
FIG. 4a shows the steps of growing an epitaxial layer over a substrate wafer followed by mask oxidation.

FIG. 4a depicts step 405, for manufacturing of sensor photodiode WSSP-V of the present invention, where the starting material of the photodiode is substrate wafer 401 over which an epitaxial layer or film 402 is deposited. In one embodiment, substrate wafer 401 is a silicon wafer of p-type conductivity while the epitaxial layer 402 is n-type impurity doped silicon. In one embodiment, epitaxial film 402 is approximately 10 µm thick such that the overall thickness of the compound device wafer 403 is approximately 400 µm. In Addition, the device wafer 403 is polished on both sides to allow greater conformity to parameters, surface flatness, and specification thickness. However, it should be understood by those of ordinary skill in the art that the above specifications are not binding and that the material type and wafer size can be easily changed to suit the design, fabrication, and functional requirements of the present invention.

Further, the device wafer 403 is subjected to a standard mask oxidation process that grows silicon oxide layers 406, 407 on front and back sides, respectively, of the device wafer 403. In one embodiment, the oxidation mask is made of silicon oxide (SiO2) or silicon nitride (Si3N4) and thermal oxidation is employed to achieve mask oxidation. In one embodiment, the oxide layers 406, 407 have a thickness ranging from 8000 to approximately 9000 Angstroms.

Figure 4B:
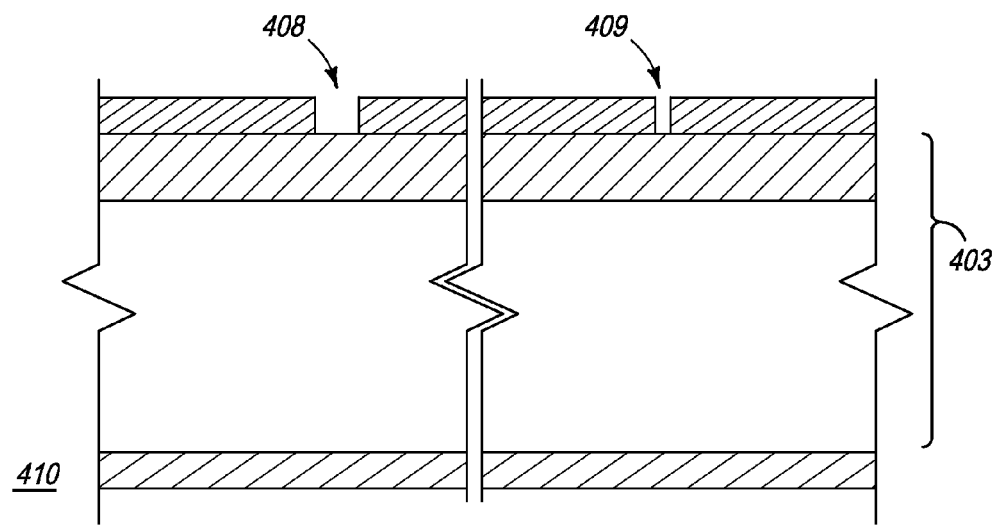
FIG. 4b shows the steps of N+ mask lithography and oxide etching on front side.

As shown in FIG. 4b, after the standard mask oxidation is complete, at step 410 the device wafer 403 is subjected to n+ photolithography on the front-side. Photolithography includes employing a photoresist layer to etch a specific pattern on the surface of the wafer. Generally, the photoresist layer is a photosensitive polymeric material for photolithography and photoengraving that can form a patterned coating on the surface. After selecting a suitable material and creating a suitable photoresist pattern, a thin photoresist layer is applied to the front side of the device wafer 403. In one embodiment, the photoresist layer is applied via a spin coating technique. Spin coating is well-known to those of ordinary skill in the art and will not be described in detail herein. The photoresist layer is then appropriately treated to reveal n+ diffusion regions 408, 409.

In one embodiment of the present invention, the device wafer 403 is subjected to n+ masking. N+ masking is employed to protect portions of device wafer 403. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The photoresist coated device wafer 403 is aligned with the n+ mask. An intense light, such as UV light, is projected through the mask, exposing the photoresist layer in the pattern of the n+ mask. The n+ mask allows selective irradiation of the photoresist on the device wafer. Regions that are exposed to radiation are hardened while those that are reserved for deep diffusion remain shielded by the n+ mask and easily removed. The exposed and remaining photoresist is then subjected to a suitable chemical or plasma etching to reveal the pattern transfer from the mask to the photoresist layer. An etching process is then employed to remove the silicon dioxide layer. In one embodiment, the pattern of the photoresist layer and/or n+ mask defines regions 408, 409 devoid of the oxide layer deposited in the step 405 and is ready for n+ diffusion.

Figure 4C:
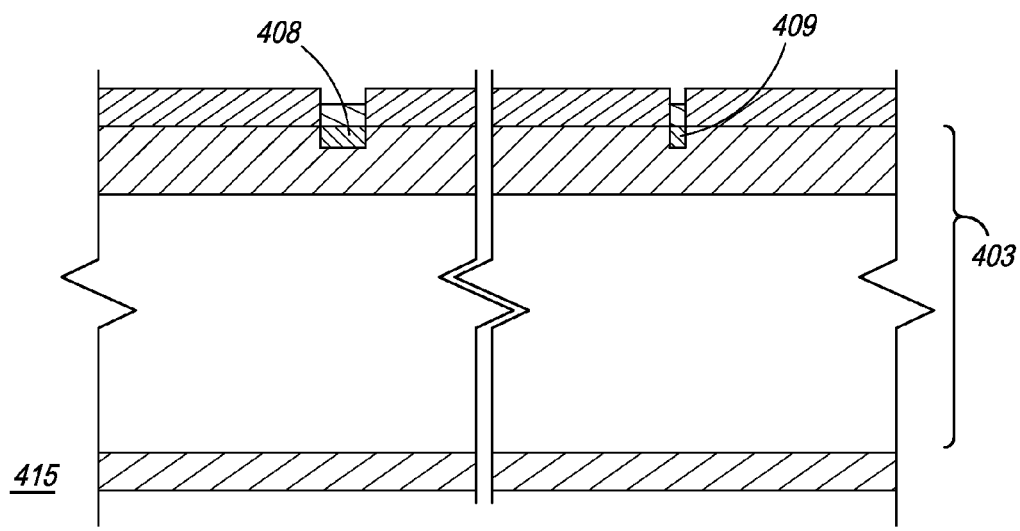
FIG. 4c shows the steps of n+ deposition followed by drive-in oxidation.

Now referring to FIG. 4c, at step 415, device wafer 403 is subjected to n+ deposition 408, 409 followed by drive-in oxidation. This n+ diffusion is needed to form ohmic contacts between cathodes 418, 422 shown in FIG. 4l, and the relatively high resistivity n-type epitaxial layer 402. An appropriate amount of dopant atoms is deposited onto the substrate wafer 403 and fills the gaps left by the removed photoresist layer. In one embodiment, the dopant atoms deposited may include phosphorous dopant atoms. Thereafter, the wafer 403 is subjected to a drive-in oxidation process that is used to redistribute the dopant atoms and deposit them deeper into the wafer. In one embodiment, the thickness of n+ regions 408, 409 are of the order of 0.110 mm and 0.025 mm. In addition, exposed silicon surfaces are oxidized.

Figure 4D:
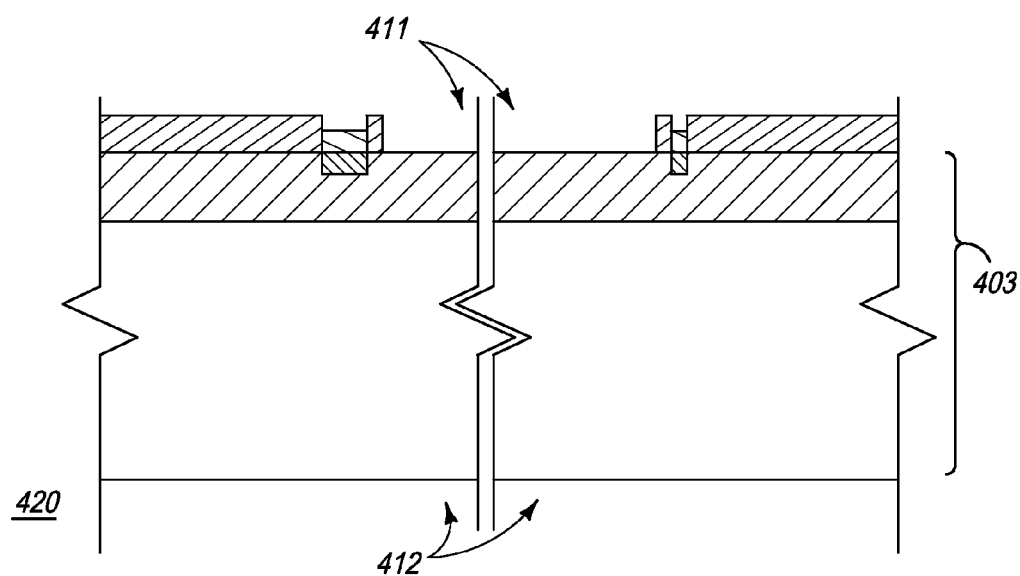
FIG. 4d shows the steps of p+ mask lithography on front side followed by oxide etching on front and back sides.

Referring now to FIG. 4d, at step 420, the front-side of the device wafer 403 undergoes p+ photolithography process to create region 411 along with oxide etching both on front and back sides. As with any conventional photolithography process, p+ photolithography comprises of the following tasks: substrate preparation; photoresist application; soft baking; mask alignment; exposure development, hard baking, and etching. In addition various other chemical treatments may be performed. In one embodiment, the pattern of the photoresist layer and/or p+ mask defines region 411 on the front side.

Also, oxide etching on the back sides defines region 412. Both regions 411, 412 are devoid of oxide layer and ready for p+ diffusion.

Figure 4E:
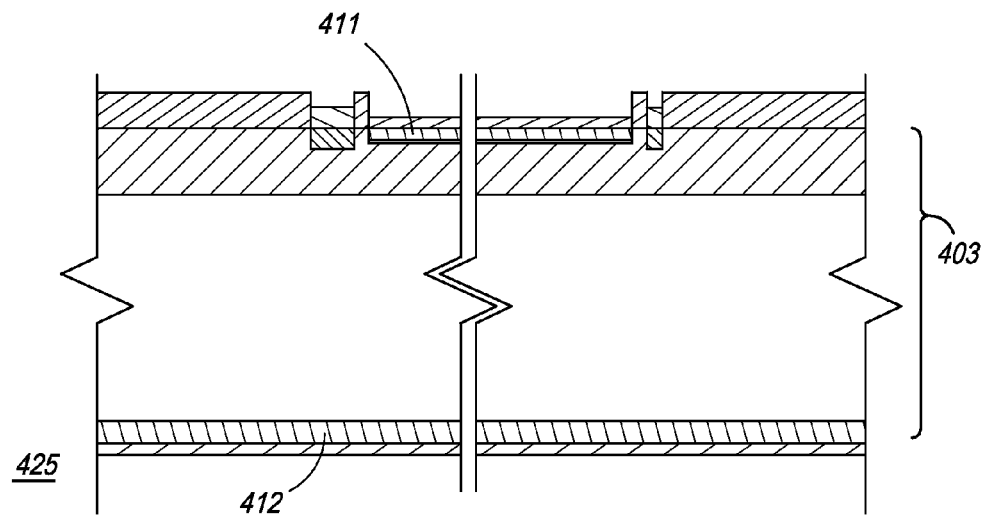
FIG. 4e shows the steps of p+ diffusion and drive-in oxidation on front and back sides.

As shown in FIG. 4e, at step 425, regions 411, 412 are subjected to p+ diffusion and drive-in oxidation. The diffusion and drive-in oxidation allows predefined and/or predetermined thermal budget in accordance with the principles of the present invention. In one embodiment of the present invention the p+ dopant is boron. In addition, exposed p+ diffused regions 411, 412 are oxidized.

Figure 4F:
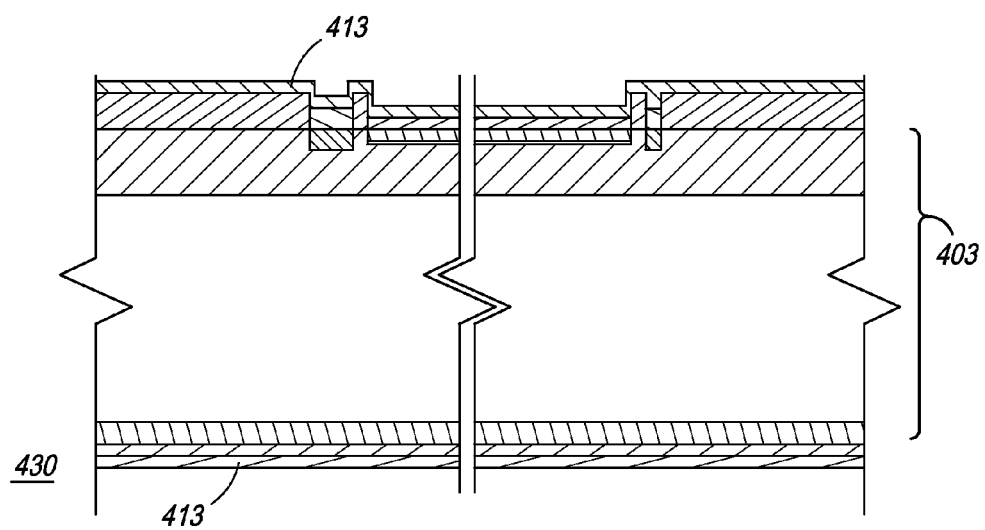
FIG. 4f shows the step of depositing an anti-reflective layer on the front and back sides.

At step 430 of FIG. 4f anti-reflecting layer 413 is applied both on front-side and back-side of the device wafer 403. In one embodiment, layer 413 is of silicon nitride that is grown thermally on both sides of the device 403.

Figure 4G:
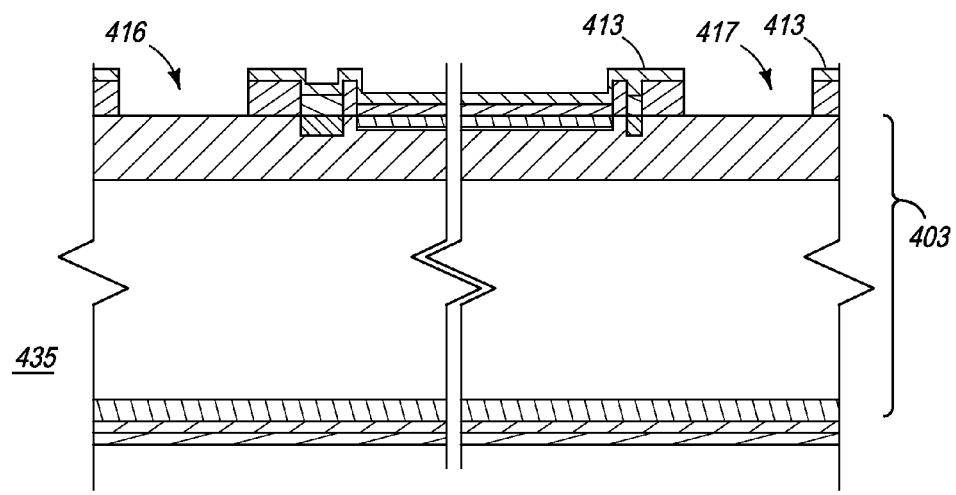
FIG. 4g shows the steps of V-groove mask lithography on the front side followed by etching the two anti-reflective layers on the front side.
Figure 4H:
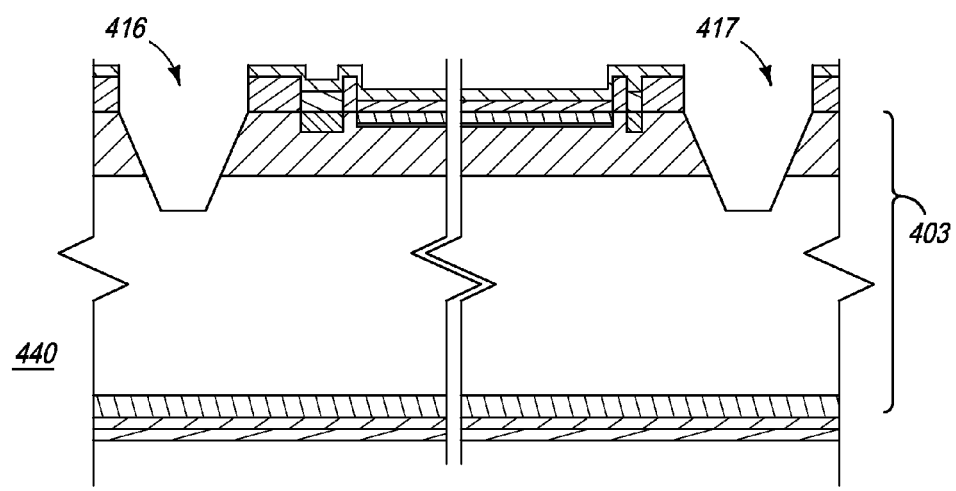
FIG. 4h shows the step of silicon etching on the front side to form V-grooves.
Figure 4I:
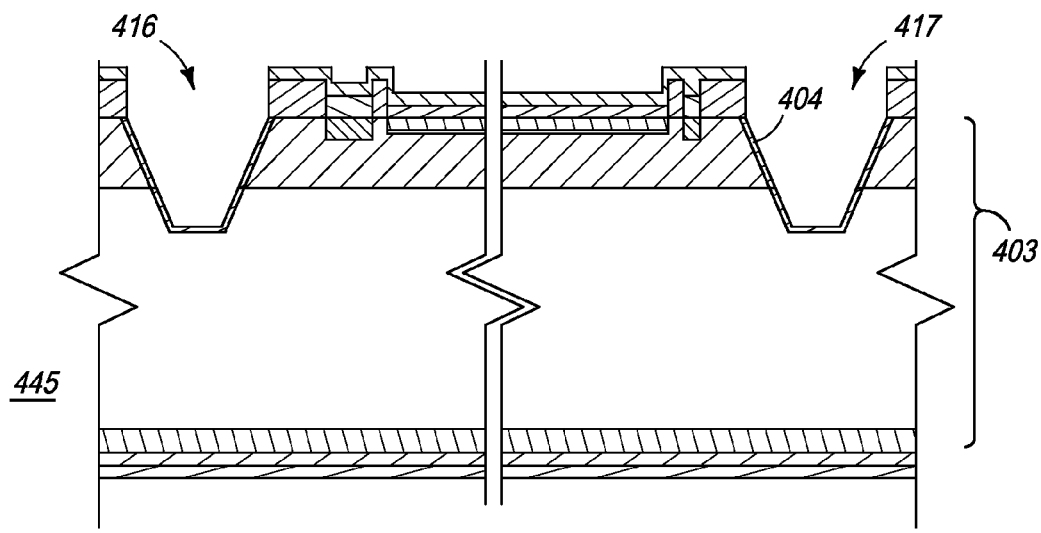
FIG. 4i shows the step of implanting a light dose of boron surface on the V-grooves exposed surfaces.

As shown in FIG. 4g, at step 435 a photo resist layer is applied on the front and back sides of the device 403 followed by V-groove mask lithography on the front side. Thereafter, the silicon nitride layer 413 and the silicon oxide layer 416—both on the front side are etched to reveal V-groove regions 416, 417. At step 440 of FIG. 4h silicon etching is performed on regions 416, 417 to form V-grooves therein in accordance with the principles of the present invention. In one embodiment, the greatest depth of the V-groove is approximately 20 μm. Further, at step 445 of FIG. 4i the exposed surfaces of the front side V-grooves 416, 417 are covered with light dose of boron surface implanted layer 404.

Figure 4J:
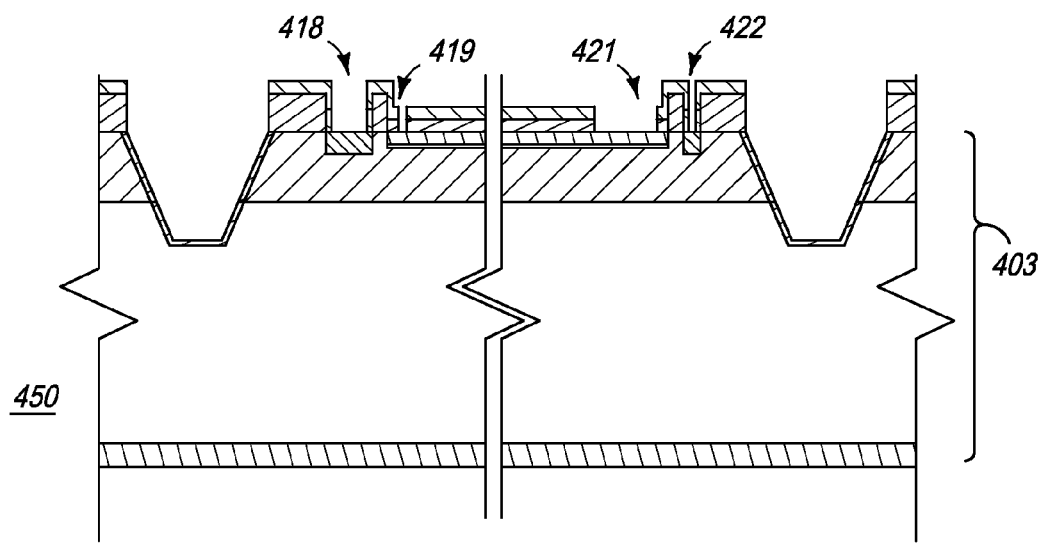
FIG. 4j shows the steps of contact window mask lithography on the front side followed by etching the two anti-reflective layers on the front and back sides.

Referring now to FIG. 4j, at step 450, a contact window mask is etched on the front-side of the device wafer. The contact mask is formed on the front-side of the device wafer 403 by using standard semiconductor technology photolithography techniques. As with any conventional photolithography process, contact window mask lithography comprises of the following tasks: substrate preparation; photoresist application; soft baking; mask alignment; exposure development, hard baking, and etching. In one embodiment, contact windows 418, 419, 421, 422 are formed by removing the anti-reflective dual layer, oxide and nitride layers, using either standard wet or standard dry etching techniques on the front-side of the device wafer.

Figure 4K:
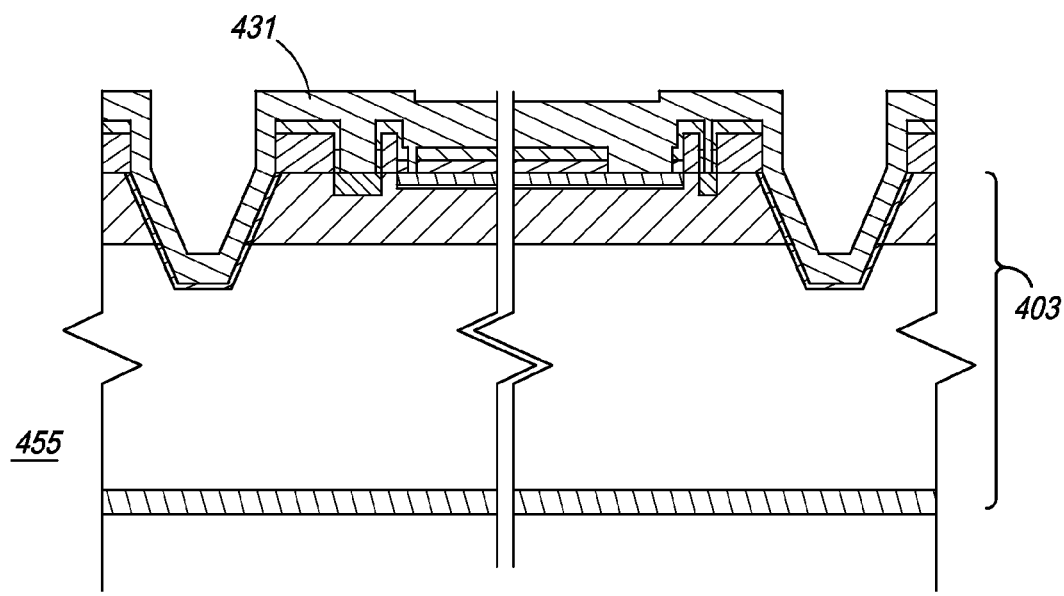
FIG. 4k shows the step of depositing metal on the front side.

At step 455, as shown in FIG. 4k, metal deposition is carried out on front side of the device wafer 403. In the metal deposition process, also known as metallization, metal layers 431 are deposited on the wafer to create conductive pathways. The most common metals include aluminum, nickel, chromium, gold, germanium, copper, silver, titanium, tungsten, platinum and tantalum.

Figure 4L:
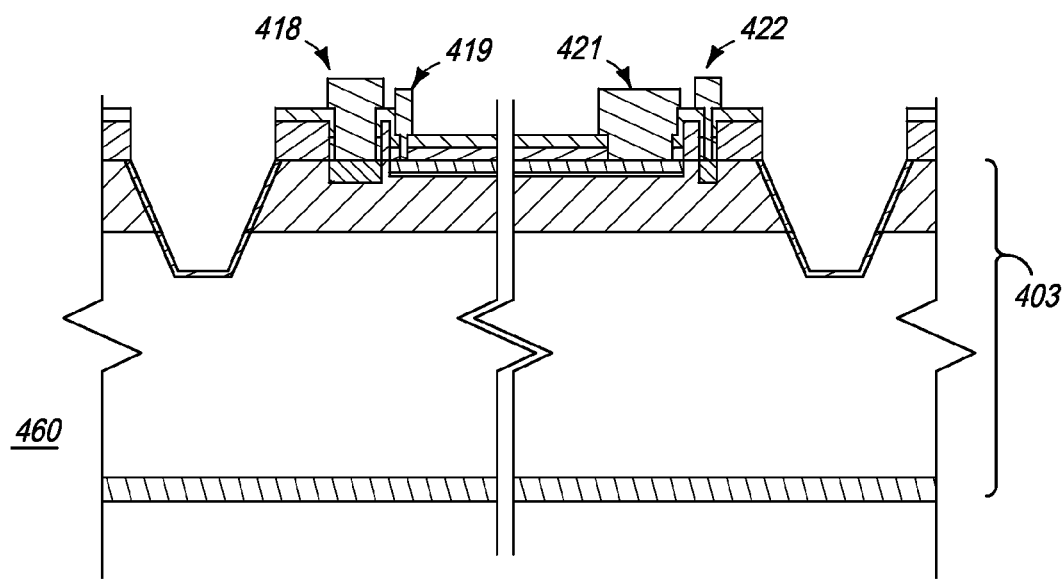
FIG. 4l shows the steps of metal mask lithography on the front side followed by metal etching.

Referring to FIG. 4l, at step 460, the front-side of the device wafer 403 undergoes a process of metal lithography thereby forming front-side metal contacts 418, 419, 421, 422. These metal contacts provide the necessary interface between the various devices and the photodiodes/photodiode arrays and for creating electrical connections to n+ and p+ diffused regions. In one embodiment of the present invention the front-side of the device wafer 403 is metal etched. Metal etching can be performed in a variety of methods including but not limited to abrasive etching, dry etching, electro etching, laser etching, photo etching, reactive ion etching, sputter etching, and vapor phase etching.

Figure 4M:
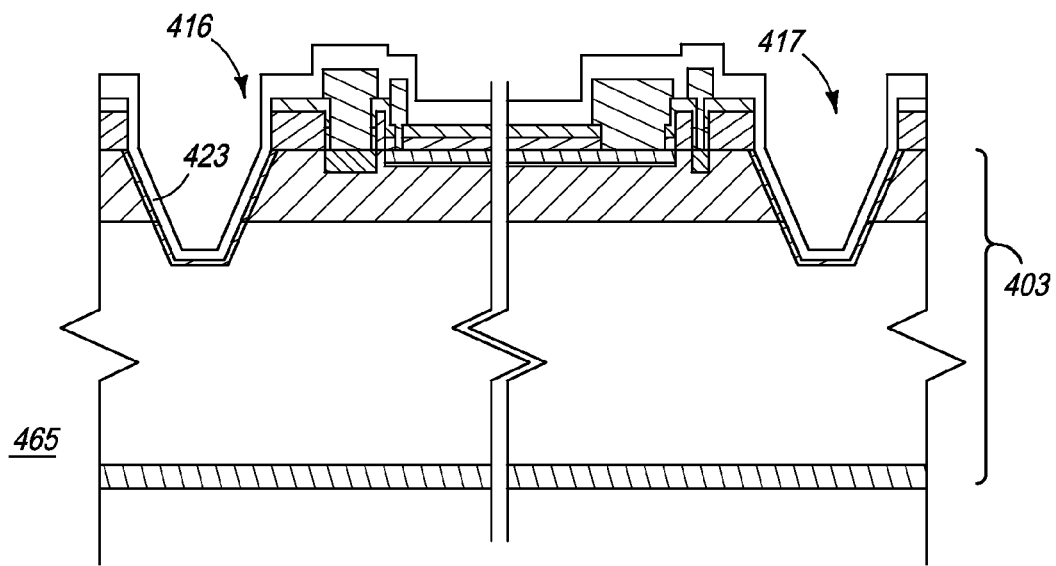
FIG. 4m shows the step of passivation of V-groove walls with PECVD oxide.
Figure 4N:
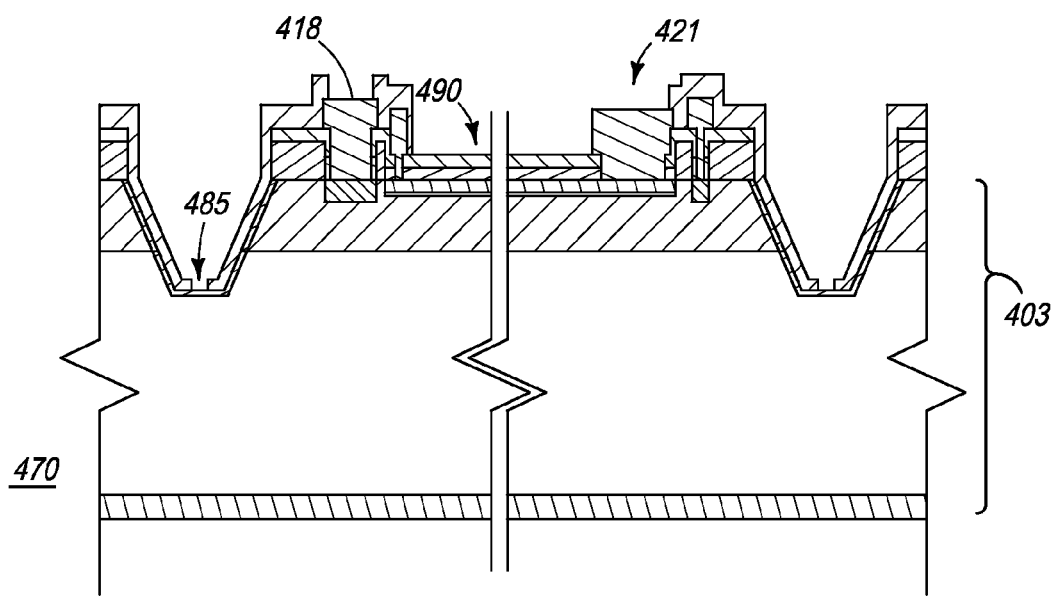
FIG. 4n shows the steps of PECVD mask lithography on the front side followed by etching PECVD oxide to reveal metal pads.

In step 465 of FIG. 4m, passivation of the walls of the V-grooves 416, 417 is done by depositing a layer 423 of PECVD (Plasma-Enhanced Chemical Vapor Deposition) oxide on the front side of the device wafer 403. This is followed by, in step 470 of FIG. 4n, PECVD mask lithography on the front side comprising tasks such as: substrate preparation; photoresist application; soft baking; mask alignment; exposure development, hard baking, and etching. In one embodiment, etching of PECVD oxide on front side at active area 490 and also at saw streets 485 is carried out to reveal metal pads 418, 421.

Figure 4O:
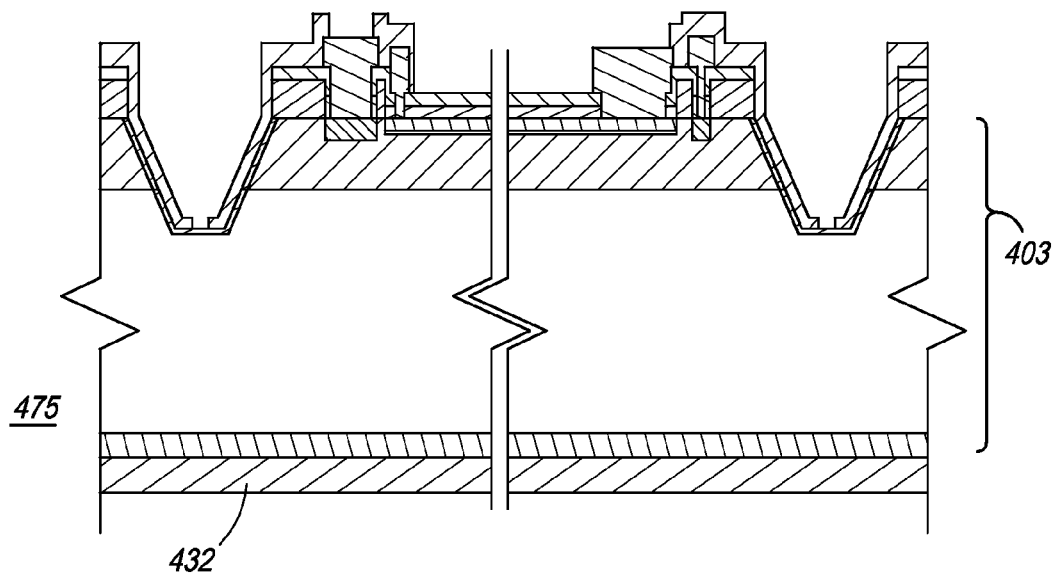
FIG. 4o shows the step of depositing metal on the back side.
Figure 4P:
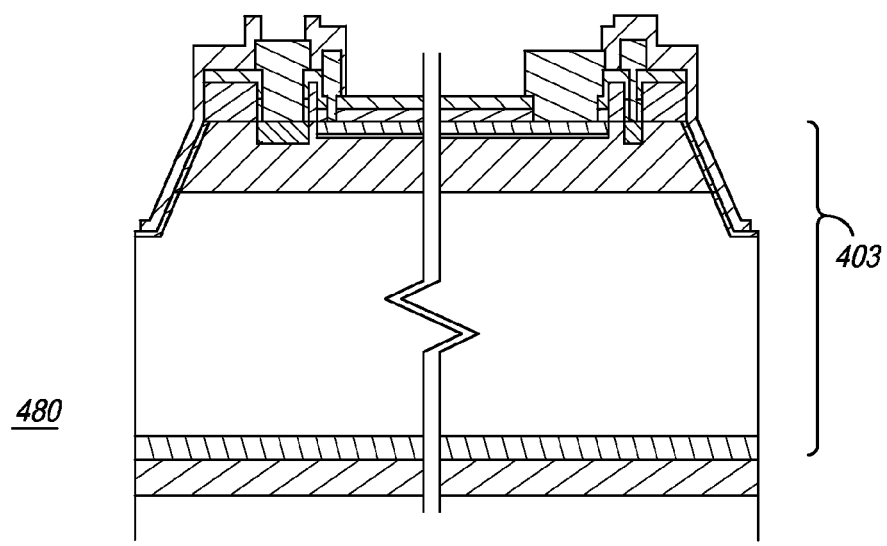
FIG. 4p shows the step of saw cutting the device to size.

At step 475 of FIG. 4o, metallization is performed to deposit metal layer 432 on the back side of the device wafer 403. Finally, at step 480 the device 403 is saw-cut, through pre-formed cutting streets, to a final chip size of FIG. 4p.

While the exemplary embodiments of the present invention are described and illustrated herein, it will be appreciated that they are merely illustrative. It will be understood by those skilled in the art that various changes in form and detail may be made therein without departing from or offending the spirit and scope of the invention.

We claim:

1. A dual junction photodiode semiconductor device comprising:
   a. a semiconductor substrate of a first conductivity type;
   b. a first impurity region of a second conductivity type formed epitaxially on said semiconductor substrate;
   c. a second impurity region of the first conductivity type shallowly formed in said epitaxially formed first impurity region;
   d. a first PN junction formed between said epitaxially formed first impurity region and said second impurity region, wherein said first PN junction exhibits a first responsivity profile to a first wavelength of light;
   e. a second PN junction formed between said semiconductor substrate and said epitaxially formed first impurity region, wherein said second PN junction exhibits a second responsivity profile to a second wavelength of light and wherein each of said first responsivity profile and said second responsivity profile have a peak responsivity greater than 0.3 A/W; and
   f. at least one passivated V-groove etched into the said epitaxially formed first impurity region and the said semiconductor substrate.

2. The dual junction photodiode semiconductor device of claim 1, wherein said two PN junctions are formed at first and second different depths from the surface of said semiconductor substrate, the second depth being deeper than the first depth.

3. The dual junction photodiode semiconductor device of claim 1, wherein said epitaxially formed first impurity region has a doping concentration of about $1 \times 10^{14}/cm^3$.

4. The dual junction photodiode semiconductor device of claim 1, further comprising:
   a. a first output electrode connected to said epitaxially formed first impurity region;
   b. a second output electrode connected to the second impurity region; and
   c. a third output electrode connected to said semiconductor substrate, wherein said first and second output electrodes are output electrodes of a first photodiode associated with said first PN junction, and said second and third output electrodes are output electrodes of a second photodiode associated with said second PN junction.

5. The dual junction photodiode semiconductor device of claim 1, wherein said first conductivity type is p+.

6. The dual junction photodiode semiconductor device of claim 1, wherein said second conductivity type is n+.

7. A dual junction photodiode semiconductor device comprising:
   a. a semiconductor substrate of a first conductivity type;
   b. a first impurity region of a second conductivity type formed epitaxially on said semiconductor substrate;
   c. a second impurity region of the first conductivity type shallowly formed in said epitaxially formed first impurity region;
   d. a first PN junction formed between said epitaxially formed first impurity region and said second impurity region and associated with a first photodiode element, wherein said first PN junction exhibits a first responsivity profile to a first wavelength of light;
   e. a second PN junction formed between said semiconductor substrate and said epitaxially formed first impurity region and associated with a second photodiode element, wherein said second PN junction exhibits a second responsivity profile to a second wavelength of light and wherein each of said first responsivity profile and said second responsivity profile have a peak responsivity greater than 0.3 A/W;
   f. the two PN junctions formed at first and second different depths from the surface of said semiconductor substrate, the second depth being deeper than the first depth;
   g. at least one V-groove etched into the said epitaxially formed first impurity region and the said semiconductor substrate; and
   h. a dose of said first conductivity type surface implanted onto walls of the said at least one V-groove prior to passivation of the said at least one V-groove.

8. The dual junction photodiode semiconductor device of claim 7, wherein said epitaxially formed first impurity region has a doping concentration of about $1 \times 10^{14}/cm^3$.

9. The dual junction photodiode semiconductor device of claim 7, further comprising:
   a. a first output electrode connected to said epitaxially formed first impurity region;
   b. a second output electrode connected to the second impurity region; and
   c. a third output electrode connected to said semiconductor substrate, wherein said first and second output electrodes are output electrodes of the said first photodiode associated with said first PN junction, and said second and third output electrodes are output electrodes of the said second photodiode associated with said second PN junction.

10. The dual junction photodiode semiconductor device of claim 7, wherein said first conductivity type is p+.

11. The dual junction photodiode semiconductor device of claim 7, wherein said second conductivity type is n+.

12. A dual junction photodiode semiconductor device comprising:
   a. a semiconductor substrate of a first conductivity type;
   b. a first impurity region of a second conductivity type formed epitaxially on said semiconductor substrate;
   c. a second impurity region of the first conductivity type shallowly formed in said epitaxially formed first impurity region;
   d. a first PN junction formed between said epitaxially formed first impurity region and said second impurity region and associated with a first photodiode element, wherein said first PN junction exhibits a first responsivity profile to a first wavelength of light;
   e. a second PN junction formed between said semiconductor substrate and said epitaxially formed first impurity region and associated with a second photodiode element, wherein said second PN junction exhibits a second responsivity profile to a second wavelength of light and wherein each of said first responsivity profile and said second responsivity profile have a peak responsivity greater than 0.3 A/W;

f. at least one V-groove etched into the said epitaxially formed first impurity region and the said semiconductor substrate; and g. a dose of said first conductivity type surface implanted onto walls of the said at least one V-groove.

13. The dual junction photodiode semiconductor device of claim 12, wherein said two PN junctions are formed at first and second different depths from the surface of said semiconductor substrate, the second depth being deeper than the first depth.

14. The dual junction photodiode semiconductor device of claim 12, wherein said epitaxially formed first impurity region has a doping concentration of about $1 \times 10^{14}/cm^3$.

15. The dual junction photodiode semiconductor device of claim 12, further comprising:

a. a first output electrode connected to said epitaxially formed first impurity region;

b. a second output electrode connected to the second impurity region; and c. a third output electrode connected to said semiconductor substrate, wherein said first and second output electrodes are output electrodes of the said first photodiode associated with said first PN junction, and said second and third output electrodes are output electrodes of the said second photodiode associated with said second PN junction.

16. The dual junction photodiode semiconductor device of claim 12, wherein said first conductivity type is p+.

17. The dual junction photodiode semiconductor device of claim 12, wherein said second conductivity type is n+.

* * * * *